United States Patent
Ahn et al.

(10) Patent No.: US 9,444,066 B2
(45) Date of Patent: Sep. 13, 2016

(54) ORGANIC ELECTROLUMINESCENT DEVICE AND ORGANIC ELECTROLUMINESCENT DISPLAY DEVICE

(71) Applicant: LG DISPLAY CO., LTD., Seoul (KR)

(72) Inventors: So-Yeon Ahn, Seoul (KR); Chang-Wook Han, Seoul (KR); Hong-Seok Choi, Seoul (KR); Seung-Ryong Joung, Gwangmyeong-si (KR); Gwi-Jeong Cho, Daegu (KR); Hee-Dong Choi, Uiwang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/558,430

(22) Filed: Dec. 2, 2014

(65) Prior Publication Data

US 2015/0188073 A1 Jul. 2, 2015

(30) Foreign Application Priority Data

Dec. 31, 2013 (KR) .......................... 10-2013-0168049

(51) Int. Cl.
*H01L 51/50* (2006.01)
*H01L 51/52* (2006.01)
*H01L 27/32* (2006.01)

(52) U.S. Cl.
CPC ....... *H01L 51/5044* (2013.01); *H01L 27/3209* (2013.01); *H01L 27/3244* (2013.01); *H01L 51/5278* (2013.01); *H01L 2251/558* (2013.01)

(58) Field of Classification Search
CPC .......... H01L 27/3209; H01L 51/5278; H01L 51/5036–51/5044
See application file for complete search history.

(56) References Cited

U.S. PATENT DOCUMENTS

| | | | |
|---|---|---|---|
| 7,868,321 B2 * | 1/2011 | Lee | H01L 51/5036 313/504 |
| 2012/0098011 A1 * | 4/2012 | Choi | H01L 27/3209 257/40 |
| 2012/0205685 A1 | 8/2012 | Seo et al. | |
| 2013/0146850 A1 | 6/2013 | Pieh et al. | |
| 2013/0320837 A1 * | 12/2013 | Weaver | H01L 27/3209 313/504 |
| 2014/0084269 A1 * | 3/2014 | Weaver | H01L 27/3209 257/40 |

FOREIGN PATENT DOCUMENTS

CN          103165817 A          6/2013

* cited by examiner

*Primary Examiner* — Mariceli Santiago
(74) *Attorney, Agent, or Firm* — Birch, Stewart, Kolasch & Birch, LLP

(57) ABSTRACT

An organic electroluminescent device and organic electroluminescent display device having enhanced efficiency are discussed. In one example, the organic electroluminescent device includes first and second electrodes facing each other on a substrate and at least two emission layers formed between the first and second electrodes and realizing blue light, wherein, among the emission layers, a first blue emission layer close to the first electrode includes a first blue dopant having a different maximum luminescence wavelength than that of a second blue dopant of a second blue emission layer close to the second electrode.

12 Claims, 6 Drawing Sheets

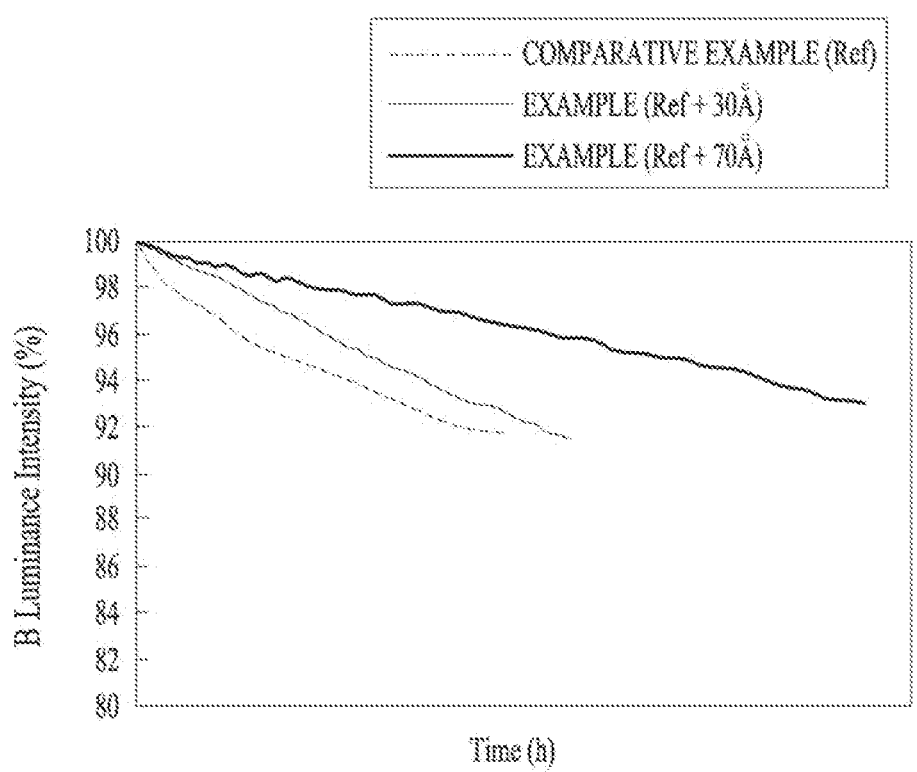

ORGANIC ELECTROLUMINESCENT DEVICE AND ORGANIC ELECTROLUMINESCENT DISPLAY DEVICE

This application claims the benefit of Korean Patent Application No. 10-2013-0168049, filed on Dec. 31, 2013, which is hereby incorporated by reference as if fully set forth herein.

BACKGROUND OF THE INVENTION

1. Field of the Invention

The present invention relates to an organic electroluminescent device and organic electroluminescent display device having enhanced efficiency.

2. Discussion of the Related Art

With the advent of the information era, the field of displays, which visually display electrical information signals, has rapidly developed. In line with such trend, a variety of ultra-thin and light flat display devices with low power consumption have been developed.

Examples of such flat display devices include, but are not limited to, a liquid crystal display (LCD) device, a plasma display panel (PDP) device, a field emission display (FED) device, and an organic light emitting device (OLED).

In particular, OLEDs are self-emissive and have faster response time, higher luminous efficacy, higher brightness and wider viewing angle than other flat display devices. An OLED includes an anode, a hole injection layer, a hole transport layer, an emission layer, an electron transport layer, an electron injection layer, and a cathode.

Such OLEDs include, between first and second electrodes, a single light emitting unit including a hole injection layer, a hole transport layer, an emission layer, an electron transport layer, and an electron injection layer. However, recently, multiple light emitting units are formed between first and second electrodes.

However, blue light emitting units included in conventional multiple light emitting units include fluorescent blue emission layers. In this regard, a blue emission layer has a lower efficiency than emission layers that realize other colors and thus total panel efficiency is also reduced.

SUMMARY OF THE INVENTION

Accordingly, the present invention is directed to an organic electroluminescent device and an organic electroluminescent display device that substantially obviate one or more problems due to limitations and disadvantages of the related art.

An object of the present invention is to provide an organic electroluminescent device and organic electroluminescent display device having enhanced efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device includes first and second electrodes facing each other on a substrate and at least two emission layers formed between the first and second electrodes and realizing blue light, wherein, among the emission layers, a first blue emission layer close to the first electrode includes a first blue dopant having a different maximum luminescence wavelength than that of a second blue dopant of a second blue emission layer close to the second electrode.

The organic electroluminescent device may further include first, second and third light emitting units formed between the first and second electrodes, wherein any one of the first and second light emitting units includes the first blue emission layer, the other of the first and second light emitting units includes a yellow-green emission layer, and the third light emitting unit includes the second blue emission layer.

The maximum luminescence wavelength of the first blue dopant may be greater than the maximum luminescence wavelength of the second blue dopant.

The maximum luminescence wavelength of each of the first and second blue dopants is 430 nm to 480 nm, and the maximum luminescence wavelength of the first blue dopant is greater by 4 nm to 50 nm than the maximum luminescence wavelength of the second blue dopant.

The maximum luminescence wavelength of the second blue dopant is 430 nm to less than 456 nm, and the maximum luminescence wavelength of the first blue dopant is 456 nm to 480 nm.

A distance from a rear surface of the first blue emission layer of the first light emitting unit to a rear surface of the yellow-green emission layer of the second light emitting unit may be 600 Å to 1000 Å.

The organic electroluminescent device may further include N-type and P-type charge generation layers respectively formed between the first and second light emitting unit and between the second and third light emitting units, wherein the N-type charge generation layer disposed between the first blue emission layer of the first light emitting unit and the yellow-green emission layer of the second light emitting unit may have a thickness of 50 Å to 500 Å.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 7A and 7B are graphs showing lifespan characteristics of an organic electroluminescent device according to Comparative Example and the organic electroluminescent device of FIG. 5, according to the thickness of an N-type charge generation layer of a first charge generation layer.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
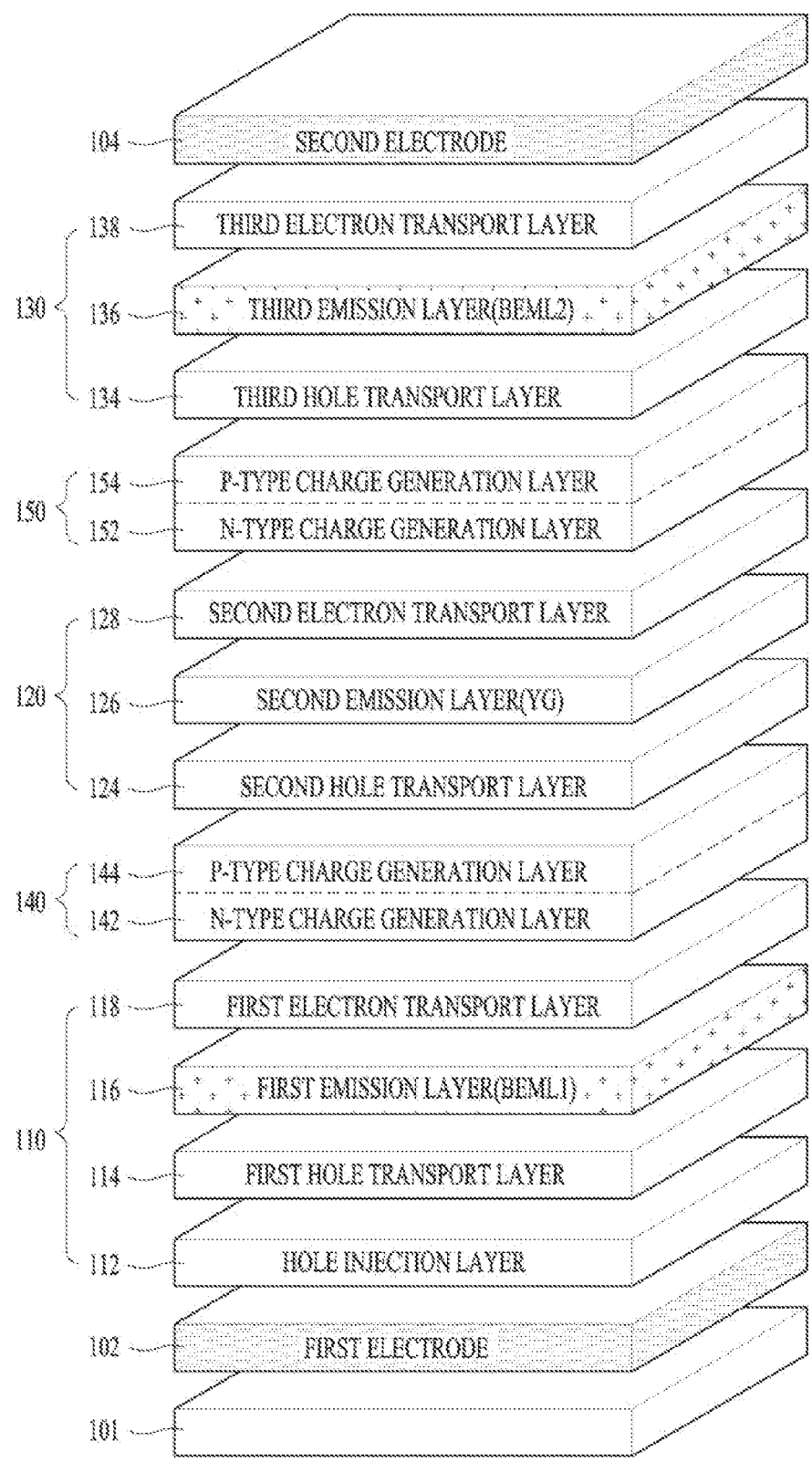
FIG. 1 is a perspective view of an organic electroluminescent according to a first embodiment of the present invention.

FIG. 1 is a perspective view of an organic electroluminescent device according to a first embodiment of the present invention.

The organic electroluminescent device illustrated in FIG. 1 includes first and second electrodes 102 and 104 facing each other on a substrate 101, first, second and third light emitting units 110, 120 and 130 formed between the first and second electrodes 102 and 104, and first and second charge generation layers 140 and 150 respectively formed between the first and second light emitting units 110 and 120 and between the second and third light emitting units 120 and 130.

At least one of the first and second electrodes 102 and 104 is formed as a semi-transparent electrode. When the first electrode 102 is a semi-transparent electrode and the second electrode 104 is a reflective electrode, the organic electroluminescent device is of a bottom emission type that emits light to the lower side. When the second electrode 104 is a semi-transparent electrode and the first electrode 102 is a reflective electrode, the organic electroluminescent device is of a top emission type that emits light to the upper side. In another embodiment, the first and second electrodes 102 and 104 may be formed as a transparent electrode and thus the organic electroluminescent device is of a dual emission type that emits light to the upper and lower sides.

The semi-transparent electrode is formed of a transparent conductive material such as indium tin oxide (ITO), indium zinc oxide (IZO), or the like and an opaque conductive material such as aluminum (Al), gold (Au), molybdenum (MO), chromium (Cr), copper (Cu), LiF, or the like. The reflective electrode is formed of a reflective metal material such as Al, Au, Mo, Cr, Cu, LiF, or the like and is formed as multiple layers including such materials.

In embodiments of the present invention, a case in which the first electrode 102 as an anode is formed as a semi-transparent electrode and the second electrode 104 as a cathode is formed as a reflective electrode will be described by way of example.

The first light emitting unit 110 is closer to the first electrode 102 than the second and third light emitting units 120 and 130. That is, the first light emitting unit 110 is formed between the first electrode 102 and the first charge generation layer 140. The first light emitting unit 110 includes a hole injection layer 112, a first hole transport layer 114 formed as at least one layer, a first emission layer 116, and a first electron transport layer 118 that are sequentially formed on the first electrode 102. The first hole transport layer 114 supplies holes from the first electrode 102 to the first emission layer 116, the first electron transport layer 118 supplies electrons from an N-type charge generation layer 142 of the first charge generation layer 140 to the first emission layer 116, and the holes supplied via the first hole transport layer 114 and the electrons supplied via the first electron transport layer 118 are recombined in the first emission layer 116, thereby emitting light.

The second light emitting unit 120 is formed between the first and third light emitting units 110 and 130. The second light emitting unit 120 includes a second hole transport layer 124 formed as at least one layer, a second emission layer 126, and a second electron transport layer 128 that are sequentially formed on the first charge generation layer 140. The second hole transport layer 114 supplies holes from a P-type charge generation layer 144 of the first charge generation layer 140 to the second emission layer 126, the second electron transport layer 128 supplies electrons from an N-type charge generation layer 152 of the second charge generation layer 150 to the first emission layer 126, and the holes supplied via the P-type charge generation layer 144 of the first charge generation layer 140 and the electrons supplied via the N-type charge generation layer 152 of the second charge generation layer 150 are recombined in the second emission layer 126, thereby emitting light.

The third light emitting unit 130 is closer to the second electrode 104 than the first and second light emitting units 110 and 120. That is, the third light emitting unit 130 is formed between the second electrode 104 and the second charge generation layer 150. The third light emitting unit 130 includes a third hole transport layer 134, a third emission layer 136, and a third electron transport layer 138 that are sequentially formed on the second charge generation layer 150. The third hole transport layer 134 supplies holes from the P-type charge generation layer 154 of the second charge generation layer 150 to the third emission layer 136, the third electron transport layer 138 supplies electrons from the second electrode 104 to the third emission layer 136, and the holes supplied via the third hole transport layer 134 and the electrons supplied via the third electron transport layer 138 are recombined in the third emission layer 136, thereby emitting light.

The first charge generation layer 140 includes the N-type charge generation layer 142 and the P-type charge generation layer 144 that are sequentially stacked, and the second charge generation layer 150 includes the N-type charge generation layer 152 and the P-type charge generation layer 154 that are sequentially stacked.

The P-type charge generation layers 144 and 154 are respectively formed between the second hole transport layer 124 and the N-type charge generation layer 142 and between the third hole transport layer 134 and the N-type charge generation layer 152, thus generating holes and electrons. The holes generated from the P-type charge generation layers 144 and 154 are injected into the second and third hole transport layers 124 and 134 respectively adjacent thereto, and the electrons generated from the P-type charge generation layers 144 and 154 are injected into the N-type charge generation layers 142 and 152.

The N-type charge generation layers 142 and 152 are respectively formed between the first electron transport layer 118 and the P-type charge generation layer 144 and between the second electron transport layer 128 and the P-type charge generation layer 154 and inject and transfer the electrons injected from the P-type charge generation layers 144 and 154 into and to the first and second electron transport layers 118 and 128.

Figure 2:
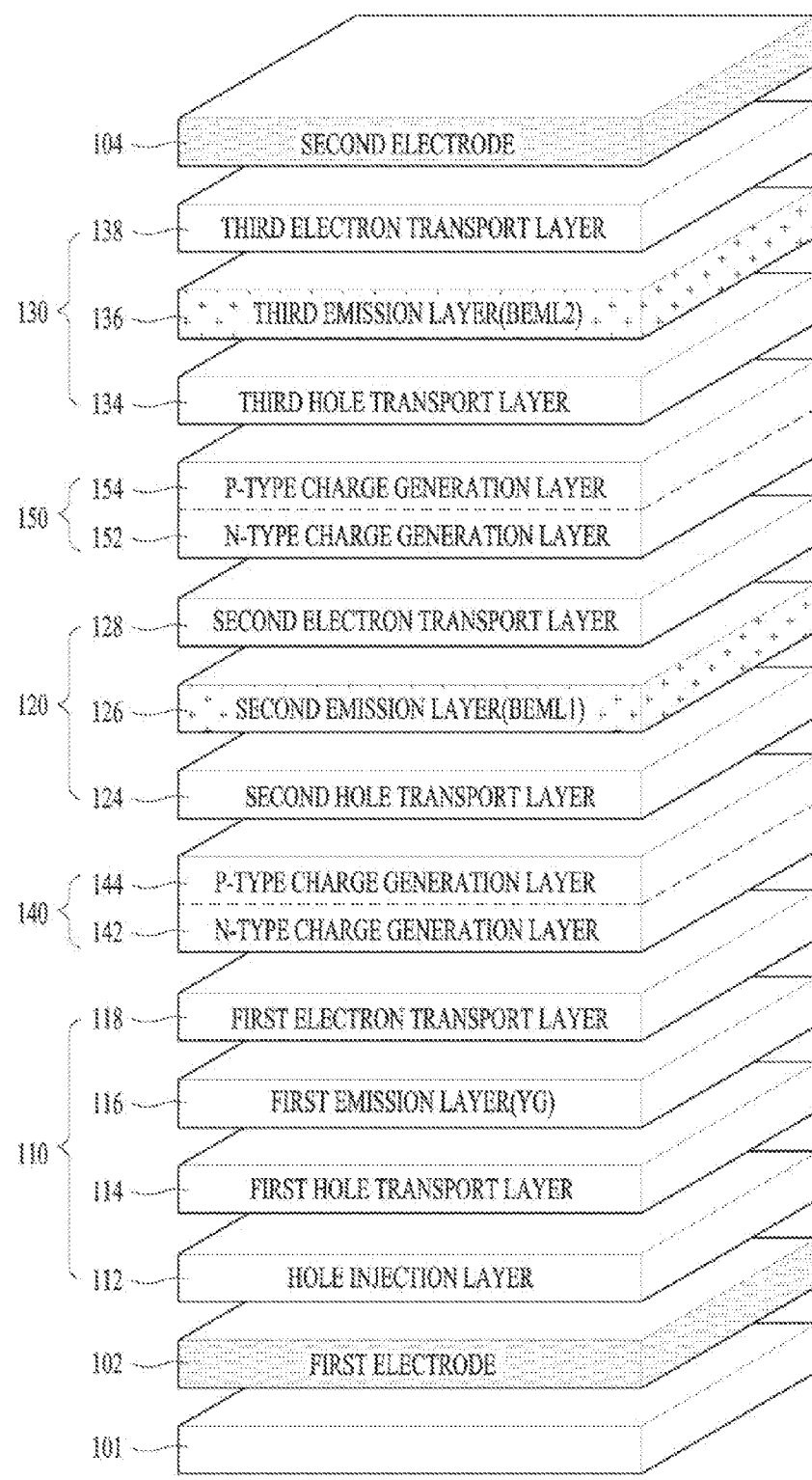
FIG. 2 is a perspective view illustrating another example of the organic electroluminescent device according to the first embodiment of the present invention.

Meanwhile, the organic electroluminescent device according to the present invention realizes white light using blue light emitted from two (BEML1 and BEML2) of the first, second and third emission layers 116, 126 and 136 and yellow-green light emitted from the other thereof. That is, as illustrated in FIG. 1, the first emission layer 116 of the first light emitting unit 110 and the third emission layer 136 of the third light emitting unit 130 includes a fluorescent or phosphorescent blue dopant and host and thus emit blue light, and the second emission layer 126 of the second light emitting unit 120 includes a fluorescent or phosphorescent yellow-green dopant and host and thus emits yellow-green light. In another embodiment, as illustrated in FIG. 2, the second and third emission layers 126 and 136 of the respective second and third light emitting units 120 and 130 include a fluorescent or phosphorescent blue dopant and host and thus emit blue light, and the first emission layer 116 of the first light emitting unit 110 includes a fluorescent or phosphorescent yellow-green dopant and host and thus emits yellow-green light.

In this regard, a first blue emission layer BEML1, which is the first or second emission layer 116 or 126 close to the first electrode 102 illustrated in FIGS. 1 and 2, and a second blue emission layer BEML2, which is the third emission layer 136 close to the second electrode 104 illustrated in FIGS. 1 and 2, have a dopant having a wavelength of 430 nm to 480 nm and may be formed of at least one of materials shown in Table 1 below, but embodiments of the present invention are not limited thereto.

TABLE 1

| | Chemical name | PL[nm] |
|---|---|---|
| BCzVBi | 4,4'-bis(9-ethyl-3-carbazovinylene)-1,1'-biphenyl | 438, 459 |
| Perylene | Perylene | 447, 471 |
| TBPe | 2,5,8,11-tetra-tert-butylperylene | 459 |
| BCzVB | 1,4-bis[2-(3-N-ethylcarbazoryl)vinyl]benzene | 438, 459 |
| DPAVB | 4-(di-p-tolylamino)-4'-[(di-p-tolylamino)styryl]stilbene | 476 |
| FIrPic | Bis(3,5-difluoro-2-(2-pyridyl)phenyl-(2-carboxypyridyl)iridium(III) | 472 |
| BDAVBi | 4,4'-bis[4-(diphenylamino)styryl]biphenyl | 461 |
| BNP3FL | N,N'-bis(naphthalen-2-yl)-N,N'-bis(phenyl)-tris-(9,9dimethylfluorenylene) | 437 |
| MDP3FL | 2,7-bis{2-[phenyl(m-tolyl)amino]-9,9-dimethyl-fluorene-7-yl}-9,9-dimethyl-fluorene | 460 |
| N-BDAVBi | N-(4-((E)-2-(6-((E)-4-(diphenylamino)styryl)naphthalen-2-yl)vinyl)phenyl)-N-phenylbenzenamine | 469 |
| Spiro-BDAVBi | 2,7-bis[4-(diphenylamino)styryl]-9,9-spirobifluorene | 480 |
| DBzA | 6-methyl-2-(4-(9-(4-(6-methylbenzo[d]thiazol-2-yl)phenyl)anthracen-10-yl)phenyl)benzo[d]thiazole | 448 |
| DSA-Ph | (E)-6-(4-(diphenylamino)styryl)-N,N-diphenylnaphthalen-2-amine | 469 |
| FIrN4 | Bis(2,4-difluorophenylpyridinato)(5-(pyridin-2-yl)-1Htetrazolate)iridium(III) | 459 |
| MQAB | (Z)-6-mesityl-N-(6-mesitylquinolin-2(1H)-ylidene)quinolin-2-amine-BF2 complex | 451.5, 476 |
| DPAFVF | 9-[4-(2-(7-(N,N-diphenylamino)-9,9-diethylflouren-2-yl)vinyl)phenyl]-9-phenyl-fluorene | 465 |

TABLE 1-continued

| | Chemical name | PL[nm] |
|---|---|---|
| (pmi)2Ir(pypz) | Bis(1-phenyl-3-methylimdazolin-2-ylidene-C,C2')(2-(2H-pyrazol-3-yl)-pyridine)Iridium(III) | 468 |
| (mpmi)2Ir(pypz) | Bis(1-(4-methylphenyl)-3-methylimdazolin-2-ylidene-C,C2') (2-(2H-pyrazol-3-yl)-pyridine)Iridium(III) | 471 |
| (fpmi)2Ir(pypz) | Bis(1-(4-fluorophenyl)-3-methylimdazoline-2-ylidene-C,C2') (2-(2H-pyrazol-3-yl)-pyridine)Iridiunm(III) | 468 |
| (fpmi)2Ir(pyim) | Bis(1-(4-fluorophenyl)-3-methylimdazoline-2-ylidene-C,C2') (2-(1H-imidazol-2-yl)pyridine)Iridiunm(III) | 474 |
| (fpmi)2Ir (tfpypz) | Bis(1-(4-fluorophenyl)-3-methylimdazoline-2-ylidene-C,C2') (2-(5-trifluoromathyl-2H-pyrazol-3-yl)-pyridine)Iridiunm(III) | 456 |
| fac-Ir(dpbic)3 | fac-Tris(1,3-diphenyl-benzimidazolin-2-ylidene-C,C2')Iridium(III) | 472 |
| (fpmi)2Ir (dmpypz) | Bis(1-(4-fluorophenyl)-3-methylimdazoline-2-ylidene-C,C2') (3,5-dimethyl-2-(1H-pyrazol-5-yl)pyridine)Iridiunm(III) | 459 |
| (mpmi)2Ir (dmpypz) | Bis(1-(4-methylphenyl)-3-methylimdazolin-2-ylidene-C,C2') (3,5-dimethyl-2-(1H-pyrazol-5-yl)pyridine)Iridium(III) | 467 |
| PCAN | 9-(9-phenylcarbazole-3-yl)-10-(naphthalene-1-yl)anthracene | |
| PCVtPh | (3-(2-(1,1':4'1"terphen-4-yl)vinyl)-9-phenyl-9H-carbazole | |
| N-BDAVBi-C6 | 4,4'-(1E,1'E)-2,2'-(naphthalene-2,6-diyl)bis(ethene-2,1-diyl)bis(N,N-bis(4-hexylphenyl)aniline) | 469 |
| FCNIrPic | Bis(3,5-difluoro-4-cyano-2-(2-pyridyl)phenyl-(2-carboxypyridyl) Iridium(III) | 460 |
| CC2TA | 2,4-Bis{3-(9H-carbazol-9-yl)-9H-carbazol-9-yl}-6-phenyl-1,3,5-triazine | 435 |
| FK306 | C33H33F4IrN2O2 | 454 |
| 2CzPN | 4,5-di(9H-carbazol-9-yl)phthalonitrile | 475 |

Figure 3:
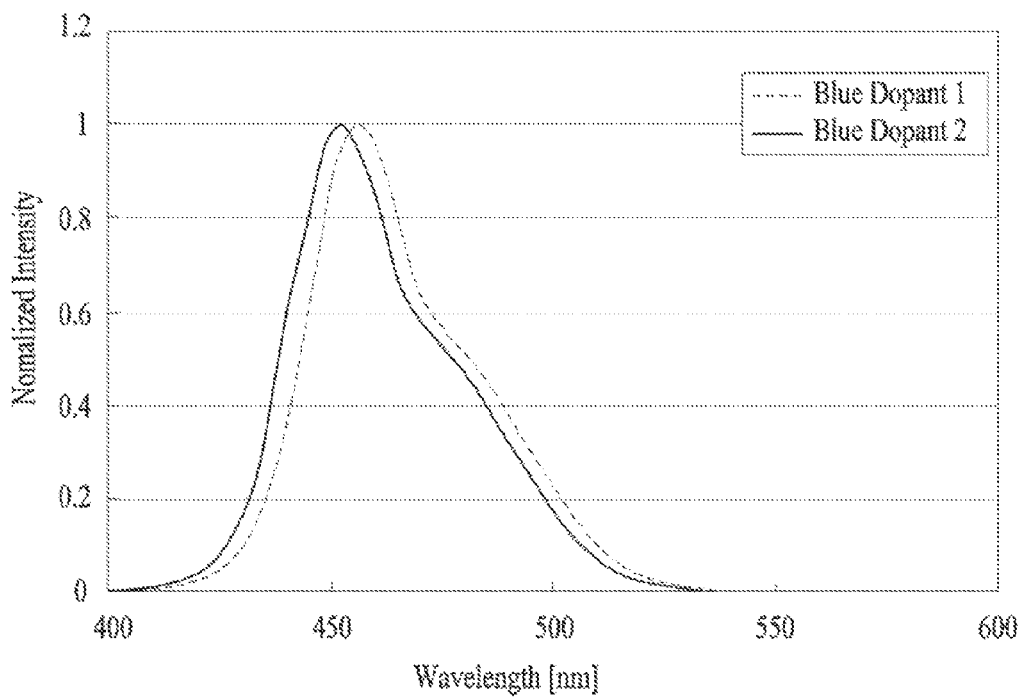
FIG. 3 is a graph showing luminescence wavelengths of first and second blue dopants of first and second blue emission layers illustrated in FIGS. 1 and 2.

In particular, a first blue dopant included in the first blue emission layer BEML1 is formed of a different material than a second blue dopant included in the second blue emission layer BEML2. In this regard, as illustrated in FIG. 3, the first blue dopant has a greater maximum luminescence wavelength than the second blue dopant. The maximum luminescence wavelength of the first blue dopant is greater by 4 nm to 50 nm than the maximum luminescence wavelength of the second blue dopant.

Figure 4:
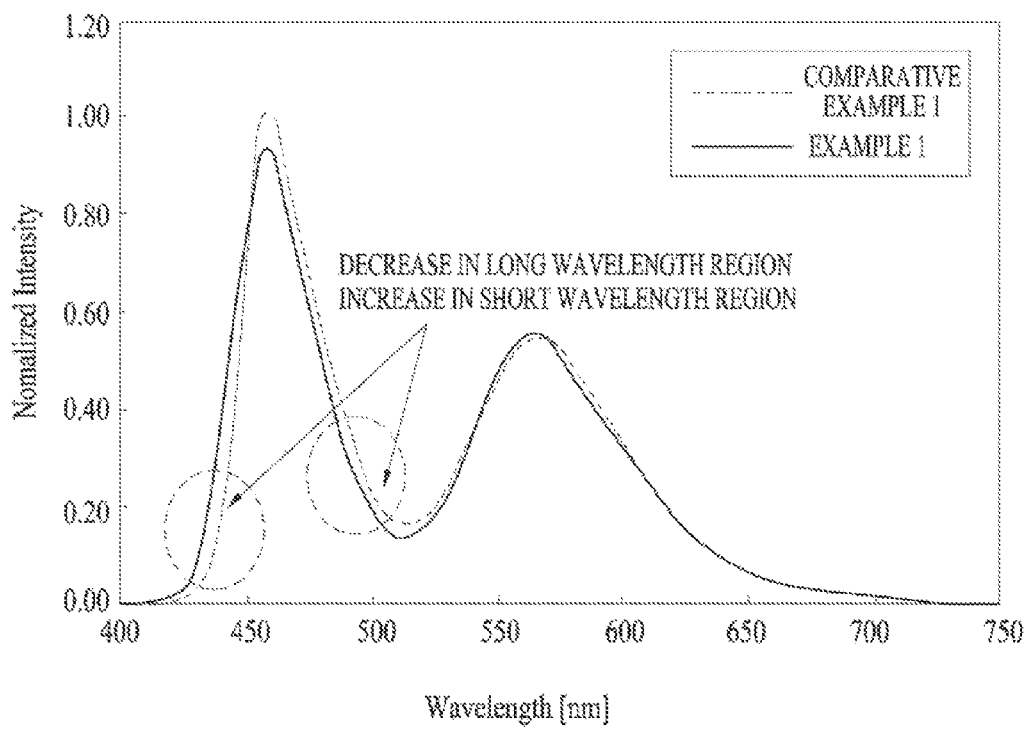
FIG. 4 is a graph showing luminescence characteristics of an organic electroluminescent device according to Comparative Example 1 and the organic electroluminescent device of FIG. 1 (Example 1)

FIG. 4 and Table 2 show electro-optical characteristics of organic electroluminescent devices of Example 1 and Comparative Example 1. In FIG. 4 and Table 2, Comparative Example 1 is a case in which first and second blue dopants are formed of the same material, and Example 1 is a case in which the first and second blue dopants are formed of different materials and thus the maximum luminescence wavelength of the first blue dopant is greater than that of the second blue dopant.

TABLE 2

| | Blue color coordinates | | | | EQE (%) | Color gamut (%) |
|---|---|---|---|---|---|---|
| | CIE 1931(x, y) | | CIE 1976(u', v') | | | |
| Comparative Example 1 | 0.138 | 0.055 | 0.163 | 0.147 | 100% | 100% |
| Example 1 | 0.1417 | 0.050 | 0.171 | 0.135 | 101% | 103% |

As illustrated in FIG. 4, in the case of Example 1, a long wavelength region decreases and a shot wavelength region increases when compared to Comparative Example 1 and thus luminescence wavelength peak is sharper than in Comparative Example 1. Accordingly, as shown in Table 2, color coordinates decrease and thus blue color purity and color gamut are enhanced. Thus, in the organic electroluminescent device of Example 1, transmittance of a color filter upon which white light is incident increases as color purity increases and thus efficiency of blue light is enhanced.

Figure 5:
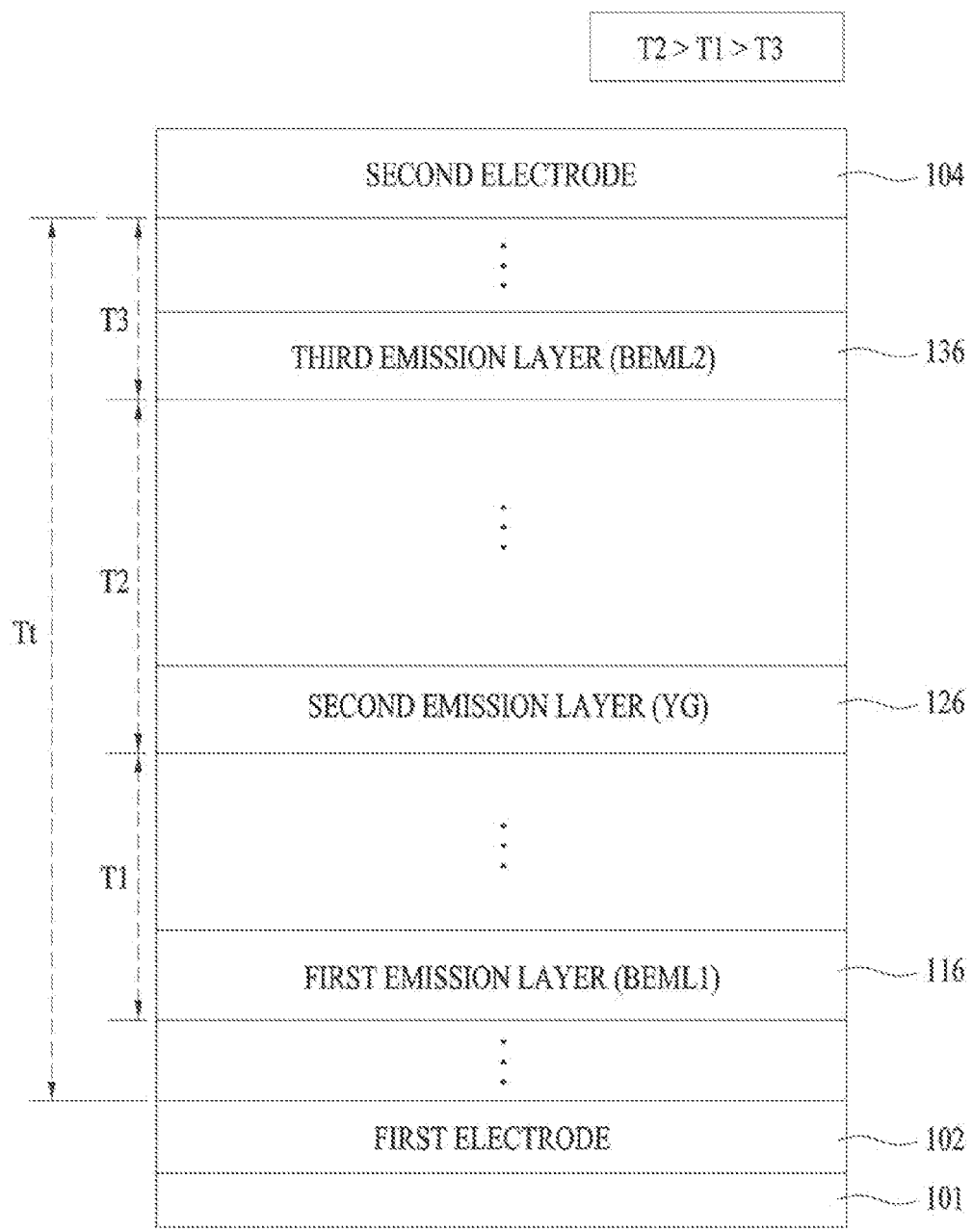
FIG. 5 is a sectional view of an organic electroluminescent device according to a second embodiment of the present invention.

FIG. 5 is a sectional view of an organic electroluminescent device according to a second embodiment of the present invention.

The organic electroluminescent device of FIG. 5 includes the same elements as those of the organic electroluminescent device of FIG. 1, except that emission layers are formed at specific positions. Thus, a detailed description of the same elements will be omitted herein.

The emission layers 116, 126 and 136 of the organic electroluminescent device according to the second embodiment of the present invention are arranged as illustrated in FIG. 5.

A separation distance T1 between the first blue emission layer BEML1, which is the first emission layer 116 close to the first electrode 102, and the second emission layer 126 that realizes yellow-green is less than a separation distance T2 between the second blue emission layer BEML2, which is the third emission layer 136 close to the second electrode 104, and the second emission layer 126 that realizes yellow-green. For example, the separation distance T1, which is a distance from a rear surface of the first emission layer 116 to a rear surface of the second emission layer 126, is 600 Å to 1000 Å, the separation distance T2, which is a distance from the rear surface of the second emission layer 126 to a rear surface of the second blue emission layer BEML2, is 1600 Å to 2000 Å, and a distance T3 from the rear surface of the second blue emission layer BEML2 to the second electrode 104 is 150 Å to 700 Å. Accordingly, a distance Tt from a front surface of the first electrode 102 to a rear surface of the second electrode 104 is 2500 Å to 5600 Å.

Figure 6:
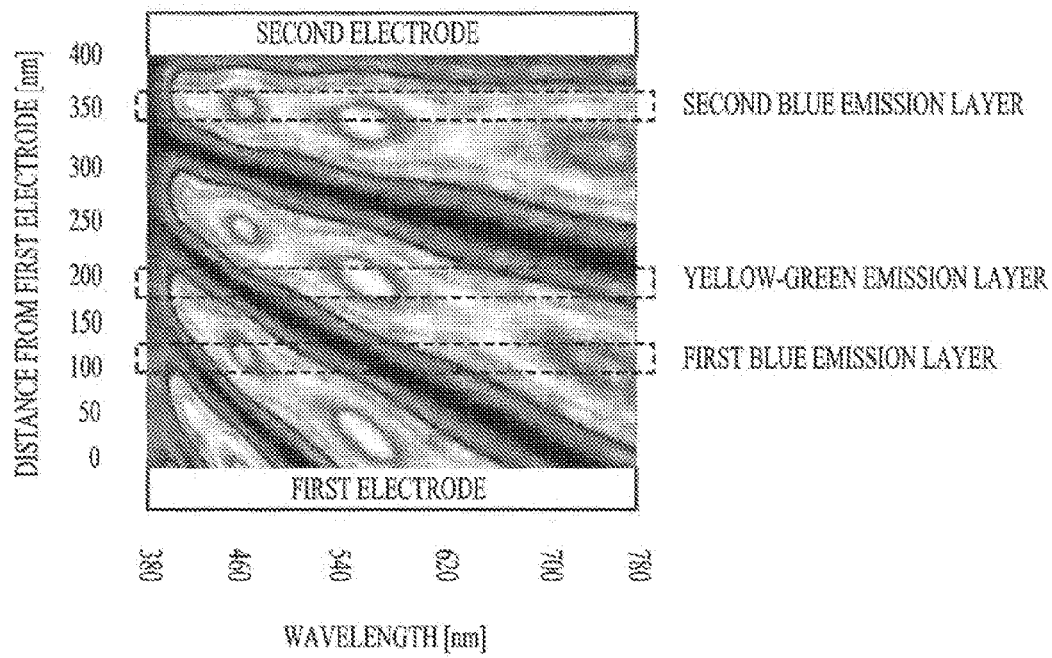
FIG. 6 is a contour map of the organic electroluminescent device illustrated in FIG. 5.

In this case, as illustrated in FIG. 6, a region separated from the first electrode 102 by 2000 Å is a region in which a center of a contour line is located and exhibits the greatest constructive interference of yellow-green light having a maximum luminescence wavelength of 550 nm to 560 nm. Regions separated from the first electrode 102 by about 1000 Å and 3500 Å are regions in which the center of the contour line is located and exhibit the greatest constructive interference of blue light having a maximum luminescence wavelength of 430 nm to 480 nm.

As such, to exhibit great constructive interference of blue light and yellow-green light, the first blue emission layer BEML1, the first electron transport layer 118, the N and P-type charge generation layers 142 and 144 of the first charge generation layer 140, and the second hole transport layer 124, disposed between the first hole transport layer 114 and the second emission layer 126 that realizes yellow-green, have to be formed to a thickness of 600 Å to 1000 Å. That is, the first thickness T1 from the rear surface of the first blue emission layer BEML1 to the rear surface of the second emission layer 126 that realizes yellow-green has to be 600 Å to 1000 Å. In addition, the thickness of the N-type charge generation layer 142 of the first charge generation layer 140 disposed between the first blue emission layer BEML1 and the second emission layer 126 has to be 50 Å to 500 Å.

Accordingly, as shown in Table 3 below, it can be confirmed that the organic electroluminescent device of Example having a first thickness T1 of 600 Å or more exhibits enhanced Y color coordinates of blue light and enhanced color gamut, when compared to a conventional organic electroluminescent device in which a first thickness from a rear surface of the first blue emission layer to a rear surface of a second emission layer that realizes yellow-green is less than 600 Å. In addition, it can be confirmed that, as the first thickness T1 increases, enhancement effects of Y color coordinates of blue light and color gamut are increased.

TABLE 3

| | Comparative Example 1 | Example | | |
|---|---|---|---|---|
| Thickness of T1 | Ref (<600 Å) | Ref + 50 Å | Ref + 100 Å | Ref + 150 Å |
| Color coordinates (Y) | 0.060 | 0.058 | 0.056 | 0.055 |
| Color gamut | 100% | 101% | 101% | 102% |

Figure 7A:
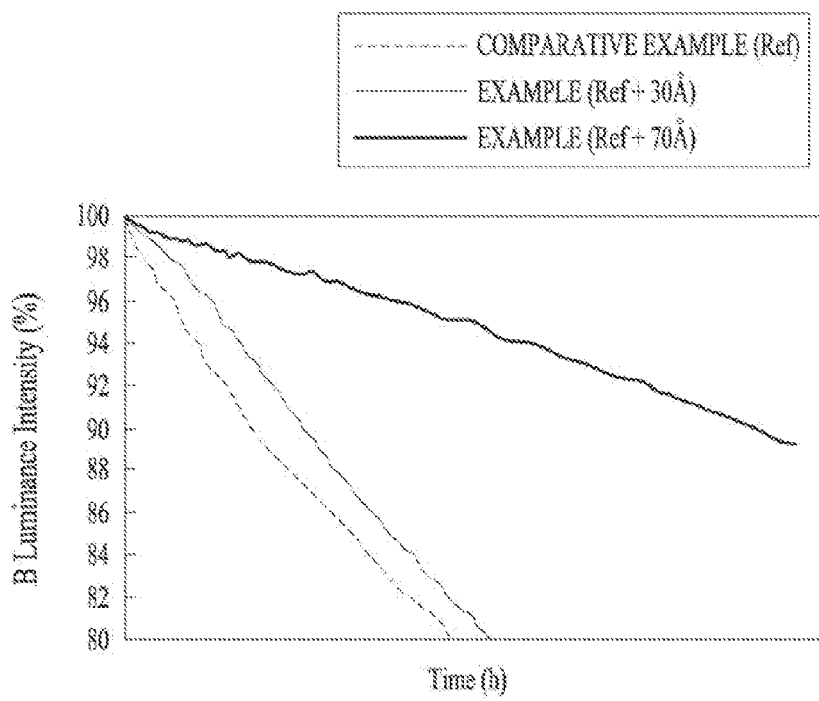

In addition, when the thickness of the N-type charge generation layer 142 of the first charge generation layer 140 increases within a range within which the distance between the rear surface of the first blue emission layer BEML1 and the rear surface of the second emission layer 126 that realizes yellow-green is 600 Å to 1000 Å, as illustrated in FIGS. 7A and 7B and Table 4 below, it can be confirmed that lifespan of a blue light emitting device and lifespan of a white light emitting display panel including the blue light emitting device are enhanced. In this regard, an N-type charge generation layer of a first charge generation layer of Comparative Example 1 has a thickness Ref of less than 50 Å, while the N-type charge generation layer 142 of the first charge generation layer 140 of Example 1 has a thickness of 50 Å to 500 Å.

TABLE 4

| | Comparative Example | Example | |
|---|---|---|---|
| Thickness of N-CGL | Ref (<50 Å) | Ref + 30 Å | Ref + 70 Å |
| T95 (hr)   B | 511 | 916 | 2723 |
| W | 1862 | 2869 | 5486 |
| ΔV@T95 | <0.60 | <0.40 | <0.10 |

Tables 5 and 6 show color gamut according to wavelength and efficiency characteristics of blue dopants according to comparative examples and examples.

TABLE 5

| | Comparative Example 2 | Comparative Example 3 | Comparative Example 4 | | Example 2 | | Comparative Example 5 | |
|---|---|---|---|---|---|---|---|---|
| Thickness T1 | Ref (<600 Å) | | Ref + 50 Å | | | | | |
| Second blue dopant | Long wavelength | Long wavelength | Long wavelength | | Short wavelength | | Short wavelength | |
| First blue dopant | Long wavelength | Long wavelength | Short wavelength | | Long wavelength | | Short wavelength | |
| Efficiency of blue light (Cd/A) | 4.00 | 4.27 | 3.67 | 3.65 | 3.71 | 3.91 | 3.44 | 3.36 |
| Color coordinates (Y) | 0.060 | 0.066 | 0.057 | 0.059 | 0.052 | 0.055 | 0.047 | 0.052 |
| Color gamut (NTSC1976) | 100% | 98% | 102% | 101% | 103% | 102% | 105% | 103% |

As shown in Table 5, the organic electroluminescent device of Example 2, in which the first thickness T1 from the rear surface of the first blue emission layer BEML1 to the rear surface of the second emission layer 126 that realizes yellow-green is increased by about 50 Å as compared to organic electroluminescent devices according to Comparative Examples 2 to 5 and the second blue dopant has a shorter wavelength than the first blue dopant, exhibits little reduction in efficiency (Cd/A) of blue light and enhanced color coordinates (y) and color gamut as compared to the organic electroluminescent devices of Comparative Examples 2 to 5. Accordingly, in the organic electroluminescent device of Example 2, the thickness of the N-type charge generation layer 142 of the first charge generation layer 140 may be increased due to a margin for the first thickness T1 and thus lifespan thereof is enhanced as compared to the organic electroluminescent devices of Comparative Examples 2 to 5.

TABLE 6

| | Comparative Example 6 | Comparative Example 7 | | Example 3 | | Comparative Example 8 | |
|---|---|---|---|---|---|---|---|
| Thickness T1 | Ref (<600 Å) + 100 Å | | | | | | |
| Second blue dopant | Long wavelength | Long wavelength | | Short wavelength | | Short wavelength | |
| First blue dopant | Long wavelength | Short wavelength | | Long wavelength | | Short wavelength | |
| Efficiency of blue light (Cd/A) | 4.27 | 3.63 | 3.62 | 3.69 | 3.89 | 3.40 | 3.32 |
| Color coordinates (Y) | 0.066 | 0.061 | 0.062 | 0.053 | 0.057 | 0.049 | 0.05 |
| Color gamut (NTSC1976) | 98% | 100% | 99% | 104% | 102% | 105% | 102% |

In addition, as shown in Table 6, the organic electroluminescent device of Example 3, in which the first thickness T1 is increased by about 100 Å as compared to organic electroluminescent devices according to Comparative Examples 6 to 8 and the second blue dopant has a shorter wavelength than the first blue dopant, exhibits little reduction in efficiency (Cd/A) of blue light and enhanced color coordinates (y) and color gamut as compared to the organic electroluminescent devices of Comparative Examples 6 to 8. Accordingly, in the organic electroluminescent device of Example 3, the thickness of the N-type charge generation layer 142 of the first charge generation layer 140 may be increased due to a margin for the first thickness T1 and thus lifespan thereof is enhanced as compared to the organic electroluminescent devices of Comparative Examples 6 to 8.

Meanwhile, in the present invention, although a case in which three light emitting units are formed has been described by way of example, four or more light emitting units including two blue emission layers may be formed.

As is apparent from the foregoing description, organic electroluminescent devices according to one or more embodiments of the present invention include at least two blue emission layers with different maximum luminescence wavelengths. In particular, a blue emission layer close to a second electrode as a cathode has a blue dopant having a shorter wavelength than that of a blue emission layer close to a first electrode as an anode. Accordingly, the organic electroluminescent devices may have enhanced efficiency, lifespan and color purity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic electroluminescent device comprising:
   first and second electrodes facing each other on a substrate; and
   at least first, second, and third light emitting units sequentially stacked on the first electrode,
   wherein the first light emitting unit comprises a first blue emission layer, the second light emitting unit comprises a yellow-green emission layer, and the third light emitting unit comprises a second blue emission layer,
   wherein the first blue emission layer close to the first electrode comprises a first blue dopant having a different maximum luminescence wavelength than that of a second blue dopant of the second blue emission layer close to the second electrode, and
   wherein a distance between the first blue emission layer and the yellow-green emission layer is less than a distance between the second blue emission layer and the yellow-green emission layer.
2. The organic electroluminescent device according to claim 1, wherein the maximum luminescence wavelength of the first blue dopant is greater than the maximum luminescence wavelength of the second blue dopant.

3. The organic electroluminescent device according to claim 2, wherein the maximum luminescence wavelength of each of the first and second blue dopants is 430 nm to 480 nm, and the maximum luminescence wavelength of the first blue dopant is greater by 4 nm to 50 nm than the maximum luminescence wavelength of the second blue dopant.

4. The organic electroluminescent device according to claim 2, wherein the maximum luminescence wavelength of the second blue dopant is 430 nm to less than 456 nm, and the maximum luminescence wavelength of the first blue dopant is 456 nm to 480 nm.

5. The organic electroluminescent device according to claim 4, wherein a distance from a rear surface of the first blue emission layer of the first light emitting unit to a rear surface of the yellow-green emission layer of the second light emitting unit is 600 Å to 1000 Å.

6. The organic electroluminescent device according to claim 5, further comprising N-type and P-type charge generation layers respectively formed between the first and second light emitting units and between the second and third light emitting units,
wherein the N-type charge generation layer disposed between the first blue emission layer of the first light emitting unit and the yellow-green emission layer of the second light emitting unit has a thickness of 50 Å to 500 Å.

7. An organic electroluminescent display device comprising:
first and second electrodes facing each other on a substrate;
a plurality of thin film transistors electrically connected to the first electrode; and
at least first, second, and third light emitting units sequentially stacked on the first electrode,
wherein the first light emitting unit includes a first blue emission layer, the second light emitting unit includes a yellow-green emission layer, and the third light emitting unit includes a second blue emission layer,
wherein, the first blue emission layer close to the first electrode comprises a first blue dopant having a different maximum luminescence wavelength than that of a second blue dopant of the second blue emission layer close to the second electrode, and
wherein a distance between the first blue emission layer and the yellow-green emission layer is less than a distance between the second blue emission layer and the yellow-green emission layer.

8. The organic electroluminescent device according to claim 7, wherein the maximum luminescence wavelength of the first blue dopant is greater than the maximum luminescence wavelength of the second blue dopant.

9. The organic electroluminescent device according to claim 8, wherein the maximum luminescence wavelength of each of the first and second blue dopants is 430 nm to 480 nm, and the maximum luminescence wavelength of the first blue dopant is greater by 4 nm to 50 nm than the maximum luminescence wavelength of the second blue dopant.

10. The organic electroluminescent device according to claim 8, wherein the maximum luminescence wavelength of the second blue dopant is 430 nm to less than 456 nm, and the maximum luminescence wavelength of the first blue dopant is 456 nm to 480 nm.

11. The organic electroluminescent device according to claim 7, wherein a distance from the rear surface of the first blue emission layer of the first light emitting unit to the rear surface of the yellow-green emission layer of the second light emitting unit ranges from over 600 Å to 1000 Å.

12. The organic electroluminescent device according to claim 7, further comprising N-type and P-type charge generation layers respectively formed between the first and second light emitting units and between the second and third light emitting units,
wherein the N-type charge generation layer disposed between the first blue emission layer of the first light emitting unit and the yellow-green emission layer of the second light emitting unit has a thickness of 50 Å to 500 Å.

* * * * *